United States Patent
Funahashi

[11] Patent Number: 6,114,686
[45] Date of Patent: Sep. 5, 2000

[54] CURRENT-TO-VOLTAGE CONVERSION IC AND A PHOTOELECTRIC CONVERSION IC

[75] Inventor: Hiroyuki Funahashi, Kyoto, Japan

[73] Assignee: Rohm Co., Ltd., Kyoto, Japan

[21] Appl. No.: 09/061,068

[22] Filed: Apr. 16, 1998

[30] Foreign Application Priority Data

Apr. 17, 1997 [JP] Japan ................... 9-099985

[51] Int. Cl.[7] .............. H03F 3/08; H03F 3/45; H03G 3/30
[52] U.S. Cl. ................ 250/214 A; 330/282; 330/308
[58] Field of Search .................... 250/214 R, 214 A, 250/214 AG, 206; 330/282, 278, 292, 293, 291, 308

[56] References Cited

U.S. PATENT DOCUMENTS

| | | | |
|---|---|---|---|
| 4,066,976 | 1/1978 | Dickopp et al. | 330/86 |
| 4,216,434 | 8/1980 | Wermuth | 330/282 |
| 5,363,055 | 11/1994 | Ribner | 330/282 |
| 5,451,904 | 9/1995 | Terada et al. | 330/282 |
| 5,602,511 | 2/1997 | Woolaway | 330/308 |
| 5,793,254 | 8/1998 | O'Connor | 330/86 |
| 5,805,019 | 9/1998 | Shin | 330/282 |
| 5,812,030 | 9/1998 | Inami et al. | 250/214 A |
| 5,917,379 | 6/1999 | Ashby et al. | 330/292 |

*Primary Examiner*—John R. Lee
*Attorney, Agent, or Firm*—Arent Fox Kintner Plotkin & Kahn, PLLC

[57] ABSTRACT

To realize a current-to-voltage conversion IC and a photoelectric conversion IC in which the available frequency range does not become narrower as the conversion gain is increased, in a current-to-voltage conversion IC that has a differential amplifier to which a negative feedback resistor of variable resistance is connected and a photodiode connected to the input terminal of the differential amplifier so that the output current of the photodiode is converted into a voltage by means of the negative feedback resistor, the differential amplifier is provided with a switch for varying the capacitance of a capacitor used as a phase compensating element so that the resistance of the negative feedback resistor and the capacitance of the differential amplifier are varied in an interlocked manner in accordance with a signal fed from outside.

4 Claims, 5 Drawing Sheets

10

CURRENT-TO-VOLTAGE CONVERSION IC AND A PHOTOELECTRIC CONVERSION IC

BACKGROUND OF THE INVENTION

1. Field of the Invention

The present invention relates to an integrated circuit for converting into a voltage an output current of a photoelectric conversion device such as constitutes the pickup of a player for minidiscs, compact discs, digital video disks, and the like.

2. Description of the Prior Art

In a player for such recording media as minidiscs (MDs), compact discs (CDs), and digital video disks (DVDs) that are read optically for data retrieval, a pickup is employed that is provided with a photodiode for performing photoelectric conversion and an integrated circuit (IC) for converting an output current of the photodiode into a voltage. Instead of providing the pickup with the current-to-voltage conversion IC and the photodiode as separate components, it is also possible to provide it with a photoelectric conversion IC (OEIC) that is formed by integrating those two components into a single IC.

FIG. 5 shows a circuit diagram of a conventional current-to-voltage conversion IC 20, as a first conventional example. In FIG. 5, numeral 1 represents a differential amplifier (operational amplifier), numeral 2 represents an analog switch, and numerals 51 and 52 represent resistors. The non-inverting input terminal (+) of the differential amplifier 1 is connected to a reference voltage $V_{ref}$. The inverting input terminal (−) of the differential amplifier 1 is connected to an input terminal IN of the current-to-voltage conversion IC 20 as a whole, and is also connected to the output terminal of the differential amplifier 1 itself through the resistor 51 on the one hand and through the resistor 52 and the analog switch 2 that are connected in parallel with the resistor 51 on the other hand. The output terminal of the differential amplifier 1 is also connected directly to an output terminal OUT of the current-to-voltage conversion IC 20 as a whole. The analog switch 2 is turned on and off by a signal that is fed from outside to a terminal CONT.

Having the construction as described above, this current-to-voltage conversion IC 20 operates as follows. When the photodiode PD that is connected to the input terminal IN and serves as a photoelectric conversion device is not receiving light, no current flows through the feedback resistor (i.e. the resistor 51 when the analog switch 2 is off (open), and the resistors 51 and 52 as connected in parallel when the analog switch 2 is on (closed)), and therefore the voltage appearing at the output terminal OUT equals $V_{ref}$. By contrast, when the photodiode PD receives light, it allows a current I to flow therethrough that is proportional to the amount of the light received. This current I flows from the output of the differential amplifier 1 through the feedback resistor, and thereby raises the voltage at the output terminal OUT by $I \times R_F$ ($R_F$ represents the resistance of the feedback resistor). In this way, the output current of the photodiode PD is converted into a voltage.

In this current-to-voltage conversion IC 20 of the first conventional example, the following equation holds: (conversion gain)=(voltage after conversion)/(input current)=$I \times R_F/I = R_F$. Here, if it is assumed that the resistances of the resistors 51 and 52 are R and R', respectively, the resistance $R_F$ of the feedback resistor is given as $R_F = R \times R'/(R+R')$ when the analog switch 2 is on, and is given as $R_F = R$ when the analog switch 2 is off. This means that turning the analog switch 2 from on to off results in increasing the conversion gain.

However, the current-to-voltage conversion IC 20 of the first conventional example described above has the following disadvantage. Specifically, there, not only does the differential amplifier 1 create a pole (hereafter referred to as the "first pole") of its own, the feedback loop creates another pole (hereafter referred to as the "second pole") due to the parasitic capacitance that exists across the photodiode PD and across the feedback resistor. To obtain a desired conversion gain, the resistance $R_F$ of the feedback resistor needs to be set to a specific resistance, and this requires that the pole frequency $\frac{1}{2}\pi C R_F$ (C represents the capacitance of the parasitic capacitance) of the second pole be so low that only a very narrow frequency range is available. In addition, as the resistance $R_F$ of the feedback resistor is increased with a view to increasing the conversion gain, the second pole shifts downward, thereby further narrowing the available frequency range.

FIG. 6 shows the frequency response of the current-to-voltage conversion IC 20. In FIG. 6, the following symbols are used:

F1P indicates the frequency of the pole created by the operational amplifier 1 itself (i.e. the first pole frequency);

F2P1 indicates the frequency of the pole created by the feedback loop (i.e. the second pole frequency) when the analog switch 2 is off;

F2P2 indicates the frequency of the pole created by the feedback loop (i.e. the second pole frequency) when the analog switch 2 is on;

G1 indicates the loop gain (when (feedback ratio)=1);

L0 indicates the open-loop gain;

L1 indicates the gain obtained when the analog switch 2 is off (i.e. when the conversion gain is high); and L2 indicates the gain obtained when the analog switch 2 is on (i.e. when the conversion gain is low).

FIG. 7 shows a circuit diagram of another conventional current-to-voltage conversion IC 30, as a second conventional example, that has been devised to solve the above-described disadvantage. In FIG. 7, numerals 3, 4, 5, and 6 represent resistors. The resistors 4, 5, and 6 are connected in series between a reference voltage $V_{ref}$ and the output of a differential amplifier 1 in this order from the reference voltage $V_{ref}$ side, and the node between the resistors 4 and 5 is connected through the resistor 3 to the inverting input terminal (−) of the differential amplifier 1. An analog switch 2 is connected in parallel with the resistor 6. Note that, in the drawings and descriptions connected to the second conventional example, such elements as are found also in the first conventional example are identified with the same reference numerals and symbols, and overlapping explanations will not be repeated.

Having the construction as described above, this current-to-voltage conversion IC 30 operates as follows. When the photodiode PD that is connected to the input terminal IN receives light, it allows a current I that is proportional to the amount of the light received to flow through the feedback resistor. This raises the voltage appearing at the output terminal OUT by $I \times (R_1 \times R_2 + R_2 \times R_3 + R_3 \times R_1)/R_2$ when the analog switch 2 is on and by $I \times \{R_1 \times R_2 + R_2 \times (R_3 + R_T) + (R_3 + R_T) \times R_1\}/R_2$ when the analog switch 2 is off. Here, it is assumed that the resistances of the resistors 3, 4, 5, and 6 are $R_1$, $R_2$, $R_3$, and $R_T$, respectively.

Accordingly, to obtain the same conversion gain as in the current-to-voltage conversion IC 20 of the first conventional example, these resistors are set to have resistances that satisfy $(R_1 \times R_2 + R_2 \times R_3 + R_3 \times R_1)/R_2 = R$, if the resistor that is connected in parallel with the analog switch 2 is ignored.

On the other hand, in the current-to-voltage conversion IC 30 of the second conventional example, the resistance $R_F$ of the feedback resistor is given as $R_F=(R_1 \times R_2+R_2 \times R_3+R_3 \times R_1)/(R_2+R_3)<(R_1 \times R_2+R_2 \times R_3+R_3 \times R_1)/R_2=R$. This means that, in the second conventional example, the same conversion gain as in the first conventional example is obtained with a lower resistance in the feedback resistor. More specifically, if it is assumed that R=12 kΩ, the same conversion gain is obtained when $R_1=R_3=2$ kΩ and $R_2=500$Ω. At this time, the feedback resistor has a resistance $R_F=2.4$ kΩ, which is one fifth as large as that in the first conventional example.

As a result, in the current-to-voltage conversion IC 30 of the second conventional example, the same conversion gain as in the first conventional example is obtained with a higher second pole frequency (½ $\pi CR_F$), and thus with a wider frequency range.

In the current-to-voltage conversion IC 30 of the second conventional example, turning the analog switch 2 from on to off results in increasing the conversion gain. This is achieved by adjusting the resistance of that one of the feedback-resistor-constituting resistors which is connected to the output, i.e. the lower-impedance side, of the differential amplifier 1. Accordingly, the effect of adjusting the resistance of this resistor on the second pole, that is, the variation of the second pole frequency resulting therefrom can be reduced to negligibly small by setting the resistor 4 to have as low a resistance $R_2$ as possible, provided that it does not make the loop gain unduly low and the frequency range unduly narrow.

Nevertheless, when the analog switch 2 is turned from on to off, the feedback ratio changes from $R_2/(R_2+R_3)$ to $R_2/(R_2+R_3+R_T)$, causing the loop gain (the gain of the feedback loop) to drop. This means that, as the conversion gain is increased, the available frequency range becomes narrower, just as in the current-to-voltage conversion IC 20 of the first conventional example.

FIG. 8 shows the frequency response of the current-to-voltage conversion IC 30. In FIG. 8, the following symbols are used:

F1P indicates the frequency of the pole created by the operational amplifier 1 itself (i.e. the first pole frequency);

F2P indicates the frequency of the pole created by the feedback loop (i.e. the second pole frequency) (constant regardless of whether the analog switch 2 is on or off);

G1 indicates the loop gain (when (feedback ratio)=$R_2/(R_2+R_3)$);

G2 indicates the loop gain (when (feedback ratio)=$R_2/(R_2+R_3+R_T)$);

L0 indicates the open-loop gain;

L3 indicates the gain obtained when the analog switch 2 is on (i.e. when the conversion gain is low); and L4 indicates the gain obtained when the analog switch 2 is off (i.e. when the conversion gain is high).

In a CD player, it is necessary to cope with different reflectances between a CD-ROM, which is a read-only medium, and a CD-R, which is a recordable medium; in a DVD player, it is necessary to cope with different levels between the signals reproduced from the first and second layers of a disk. Thus, in these players, it is essential that the conversion gain be variable. However, as described above, in conventional current-to-voltage conversion ICs, as the conversion gain is increased, the available frequency range becomes narrower. As a result, especially in CD players that offer more than 20 times the standard speed and in DVD players that offer three times the standard speed, where RF signals typically reach frequencies as high as 30 to 50 MHz, it has been impossible, with a conventional current-to-voltage conversion IC, to play back with uniform quality a CD-ROM and a CD-R in a CD player and the first and second layers of a disk in a DVD player.

SUMMARY OF THE INVENTION

An object of the present invention is to provide a current-to-voltage conversion IC and a photoelectric conversion IC in which the available frequency range does not become narrower as the conversion gain is increased.

To achieve the above object, according to one aspect of the present invention, in a current-to-voltage conversion IC having an amplifier to which a negative feedback resistor is connected and a photodiode connected to an input terminal of the amplifier to serve as a photoelectric conversion device for converting the output current of the photodiode into a voltage by means of the negative feedback resistor, the current-to-voltage conversion IC is further provided with means for varying the resistance of the negative feedback resistor and the capacitance of a capacitor used as a phase compensating element within the amplifier in an interlocked manner in accordance with a signal fed from outside.

According to another aspect of the present invention, in a photoelectric conversion IC having a photodiode serving as a photoelectric conversion device and an amplifier to which a negative feedback resistor is connected for converting the output current of the photodiode into a voltage by means of the negative feedback resistor, the photoelectric conversion IC is further provided with means for varying the resistance of the negative feedback resistor and the capacitance of a capacitor used as a phase compensating element within the amplifier in an interlocked manner in accordance with a signal fed from outside.

In a given circuit, the capacitance that is present at the point at which the voltage amplification factor is at its maximum dominates the pole frequency of the circuit (the so-called mirror effect), and therefore the lower the capacitance there, the higher the pole frequency. The present invention exploits this effect in achieving phase compensation by inserting a capacitive element at the point at which the voltage amplification factor is at its maximum.

In the constructions according to the present invention as described above, the conversion gain can be increased without narrowing the available frequency range. This is achieved by reducing the capacitance of the above-mentioned capacitor used as a phase compensating element within the amplifier (this causes the pole frequency of the amplifier itself to shift upward) as the resistance of the feedback resistor is increased (with a view to increasing the conversion gain) and in addition by establishing an appropriate relation between the curve of variation of the resistance and the curve of variation of the capacitance.

BRIEF DESCRIPTION OF THE DRAWINGS

This and other objects and features of the present invention will become clear from the following description, taken in conjunction with the preferred embodiments with reference to the accompanied drawings in which.

DESCRIPTION OF THE PREFERRED EMBODIMENTS

Figure 1:
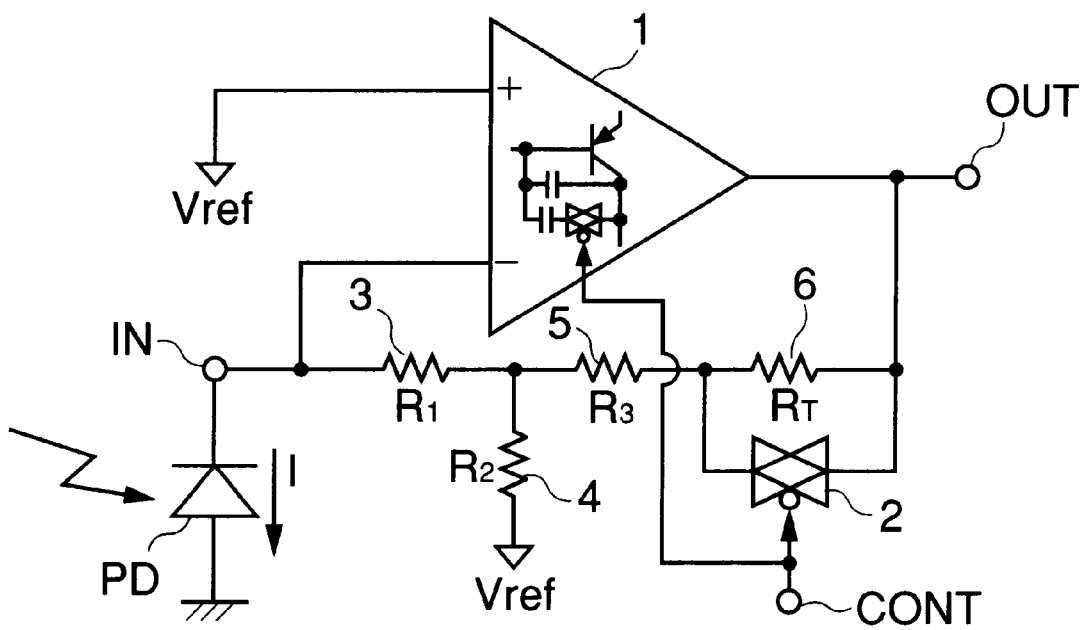
FIG. 1 is a circuit diagram of a current-to-voltage conversion IC embodying the invention.

Hereinafter, embodiments of the present invention will be described with reference to the drawings. FIG. 1 is a circuit diagram of a current-to-voltage conversion IC 10 embodying the invention. This current-to-voltage conversion IC 10 is obtained by modifying the current-to-voltage conversion IC 30 of the second conventional example in such a way that, in accordance with the signal fed from outside to the terminal CONT, not only the resistance of the feedback resistor but also the capacitance of a capacitor used as a phase compensating element within the differential amplifier 1 is varied simultaneously. This makes it possible to increase the output gain without narrowing the available frequency range. Note that, in the drawings and descriptions connected to the embodiment under discussion, such elements as are found also in the conventional examples are identified with the same reference numerals and symbols, and overlapping explanations will not be repeated.

Figure 2:
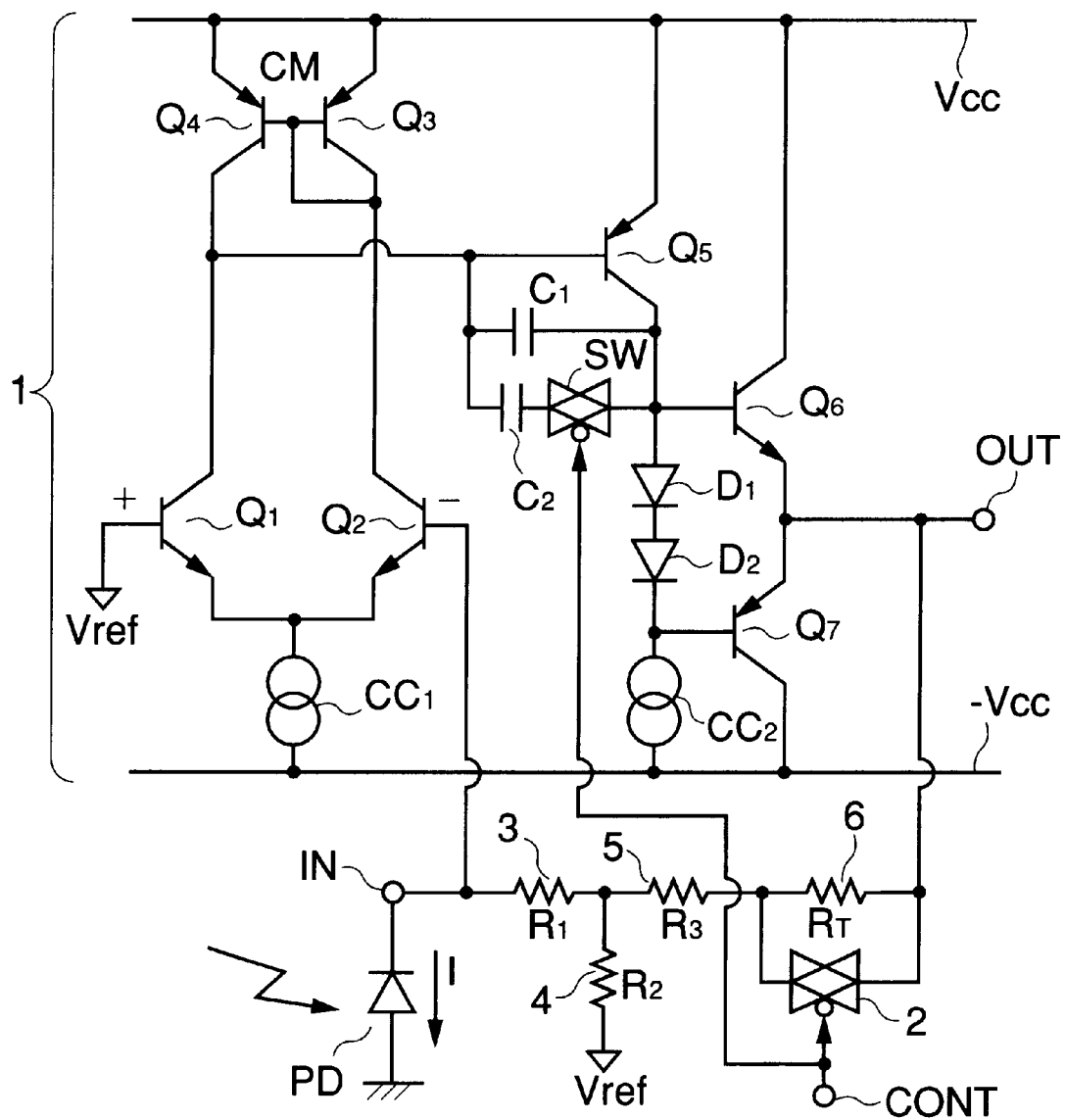
FIG. 2 is a circuit diagram of a practical example of the differential amplifier shown in FIG. 1.

Specifically, in this embodiment, the differential amplifier 1 is constructed and operates as follows. FIG. 2 is a circuit diagram of a practical example of the differential amplifier 1 shown in FIG. 1. In FIG. 2, $Q_1$, $Q_2$, and $Q_6$ represent npn-type transistors; $Q_3$, $Q_4$, $Q_5$, and $Q_7$ represent pnp-type transistors; $CC_1$ and $CC_2$ represent constant current circuits; $D_1$, and $D_2$ represent diodes; $C_1$ and $C_2$ represent capacitors; SW represents an analog switch.

The transistors $Q_1$, and $Q_2$ constitute a differential pair, with the bases of the transistors $Q_1$, and $Q_2$ serving as the non-inverting input terminal (+) and the inverting input terminal (−), respectively, of the differential amplifier 1. The transistors $Q_3$ and $Q_4$ constitute a current mirror circuit CM, with the transistors $Q_3$ and $Q_4$ serving as the input-side and output-side transistors, respectively, of the current mirror circuit CM. The transistors $Q_1$, and $Q_2$, have their collectors connected to the collectors of the transistors $Q_4$ and $Q_3$, respectively, and both have their emitters connected to one end of the constant current circuit $CC_1$, whose other end is connected to a power source line that supplies a voltage $-V_{CC}$.

The transistor $Q_5$ has its base connected to the junction between the collectors of the transistors $Q_1$ and $Q_4$. The transistor $Q_5$ has its collector connected through the two serially connected diodes $D_1$ and $D_2$ to one end of the constant current circuit $CC_2$, whose other end is connected to the power source line that supplies the voltage $-V_{CC}$. The transistor $Q_5$ has its emitter connected to a power source line that supplies a voltage $V_{CC}$.

The transistor $Q_6$ has its base connected to the junction between the collector of the transistor $Q_5$ and the diode $D_1$, and has its collector connected to the power source line that supplies the voltage $V_{CC}$. The transistor $Q_7$ has its base connected to the junction between the diode $D_2$ and the constant current circuit $CC_2$, and has its collector connected to the power source line that supplies the voltage $-V_{CC}$. The transistors $Q_6$ and $Q_7$ have their emitters connected together, with their junction serving as the output point of the differential amplifier 1.

Between the base and collector of the transistor $Q_5$, the capacitor $C_1$ is connected; in addition, in parallel therewith, the capacitor $C_2$ and the analog switch SW are connected in series. The analog switch SW, as well as the analog switch 2, is so configured as to be turned on and off in accordance with the signal that is fed from outside to the terminal CONT; these two analog switches are so controlled that, when one is on, the other is also on and, when one is off, the other is also off.

Having the construction as described above, the current-to-voltage conversion IC 10 of this embodiment operates as follows. The bases of the transistors $Q_1$ and $Q_2$ are kept at an identical voltage by feedback control. When the photodiode PD that is connected to the input terminal IN is not receiving light, the voltage appearing at the output terminal OUT equals $V_{ref}$, and therefore no current flows through the feedback resistor. By contrast, when the photodiode PD receives light, it allows a current I that is proportional to the amount of the light received to flow from the $V_{CC}$ power source line through the transistor $Q_6$, the resistor 6 or the analog switch 2, the resistor 5, and the resistor 3 to the photodiode PD. As a result, the voltage appearing at the output terminal OUT equals $V_{ref}+I \times (R_1 \times R_2 + R_2 \times R_3 + R_3 \times R_1)/R_2$ when the analog switch 2 is on and equals $V_{ref}+I \times \{R_1 \times R_2 + R_2 \times (R_3+R_T) + (R_3+R_T) \times R_1\}/R_2$ when the analog switch 2 is off.

Here, in consideration of the fact that, in a given circuit, the capacitance that is present at the point at which the voltage amplification factor is at its maximum dominates the pole frequency of the circuit (the so-called mirror effect), the amplifier is provided with a capacitor for phase compensation at the point at which the voltage amplification factor is at its maximum. Specifically, in the differential amplifier 1 of the current-to-voltage conversion IC 10 of this embodiment, the capacitors $C_1$ and $C_2$ that are connected between the base and collector of the transistor $Q_5$ serve as a phase compensating element, and therefore the lower the capacitance between the base and collector of the transistor $Q_5$, the higher the pole frequency of the differential amplifier 1 itself.

Accordingly, in the current-to-voltage conversion IC 10 of this embodiment, when the analog switch SW is turned from on to off, the capacitance between the base and collector of the transistor $Q_5$ is reduced so that the first pole frequency is shifted upward and thereby the available frequency range is made wider.

In addition, the analog switches SW and 2 are turned on and off in accordance with the signal that is fed from outside to the terminal CONT in an interlocked manner, that is, in such a way that, when one is on, the other is also on and, when one is off, the other is also off. As a result, when the analog switch 2 is turned from on to off to increase the conversion gain, the feedback ratio is reduced, and thereby the loop gain is also reduced; at the same time, however, the analog switch SW is also turned from on to off, and thereby the first pole frequency is shifted upward. In this way, the narrowing of the available frequency range is voided.

Figure 3:
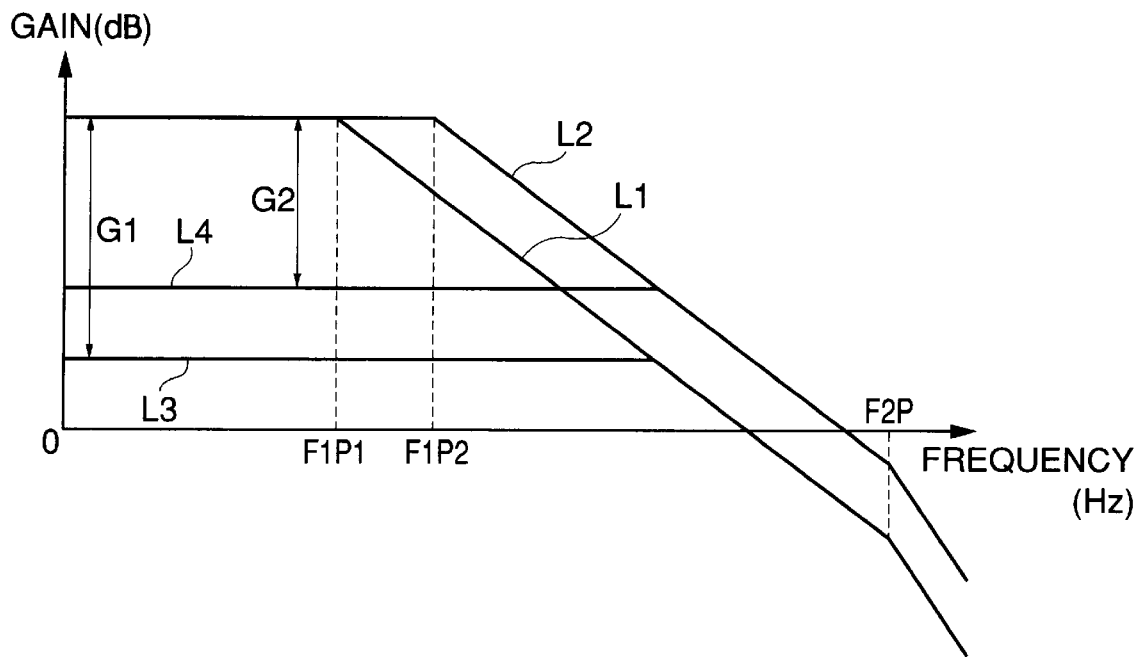
FIG. 3 is a chart showing the frequency response of the current-to-voltage conversion IC shown in FIG. 1.

FIG. 3 shows the frequency response of the current-to-voltage conversion IC 10. In FIG. 3, the following symbols are used:

F1P1 indicates the frequency of the pole created by the operational amplifier 1 itself (i.e. the first pole frequency) when the analog switch SW is on;

F1P2 indicates the frequency of the pole created by the operational amplifier 1 itself (i.e. the first pole frequency) when the analog switch SW is off;

F2P indicates the frequency of the pole created by the feedback loop (i.e. the second pole frequency) (constant regardless of whether the analog switch 2 is on or off);

G1 indicates the loop gain (when (feedback ratio)=$R_2/(R_2+R_3)$);

G2 indicated the loop gain (when (feedback ratio)=$R_2/(R_2+R_3+R_T)$);

L1 indicates the gain obtained when the analog switch SW is on (i.e. when the first pole frequency is low); and L2 indicates the gain obtained when the analog switch SW is off when the first pole frequency is high).

L3 indicates the gain obtained when the analog switch 2 is on (i.e. when the conversion gain is low); and L4 indicates the gain obtained when the analog switch 2 is off (i.e. when the conversion gain is high).

The resistance of the resistor $R_T$ is determined in accordance with the desired conversion gain. The capacitance of the capacitor $C_2$ is determined in accordance with the resistance of the resistor $R_T$ and in such a way that the narrowing of the available frequency range resulting from a drop in the loop gain caused by turning the analog switch 2 from on to off is canceled by the widening of the available frequency range resulting from an upward shift of the first pole frequency caused by turning the analog switch SW from on to off.

As described above, with the current-to-voltage conversion IC 10 of this embodiment, it is possible to increase the conversion gain without narrowing the available frequency range, and thus it is possible to obtain stable reproduction quality even in CD players that offer more than 20 times the standard speed, in DVD players that offer three times the standard speed, and the like that handle RF signals as high as 30 to 50 MHz.

In the embodiment described above, the feedback resistor includes only one resistor ($R_T$) that is connected in parallel with a switching device, so that the conversion gain can be switched in two steps; correspondingly, in the differential amplifier 1, the capacitance that acts as a phase compensating element includes only one capacitor ($C_2$) that is connected in series with a switching device, so that the first pole frequency can be switched in two steps. However, it is also possible, for the purpose of varying the output gain in finer steps while keeping a predetermined frequency range available, to configure the feedback resistor to include two or more resistors that are connected in parallel with a switching device and correspondingly configure the phase compensating element of the differential amplifier 1 to include two or more capacitors that are connected in series with a switching device; or alternatively, for the same purpose, it is also possible to replace the resistors $R_3$ and $R_T$ and the analog switch 2 with a variable resistor whose resistance can be varied by an electric signal fed from outside and replace the capacitors $C_1$ and $C_2$ and the analog switch SW with a variable capacitor whose capacitance can be varied by an electric signal fed from outside.

The embodiment described above is obtained by modifying the current-to-voltage conversion IC 30 of the second conventional example in such a way that the switching of the conversion gain and the shifting of the first pole frequency take place simultaneously. However, it is also possible to make similar modifications to the current-to-voltage conversion IC 20 of the first conventional example to obtain a current-to-voltage conversion IC (a second embodiment) in which the conversion gain can be varied without narrowing the available frequency range, though, in this case, the available frequency range is somewhat narrower than in the previously described embodiment if the conversion gain is assumed to be the same.

Figure 4:
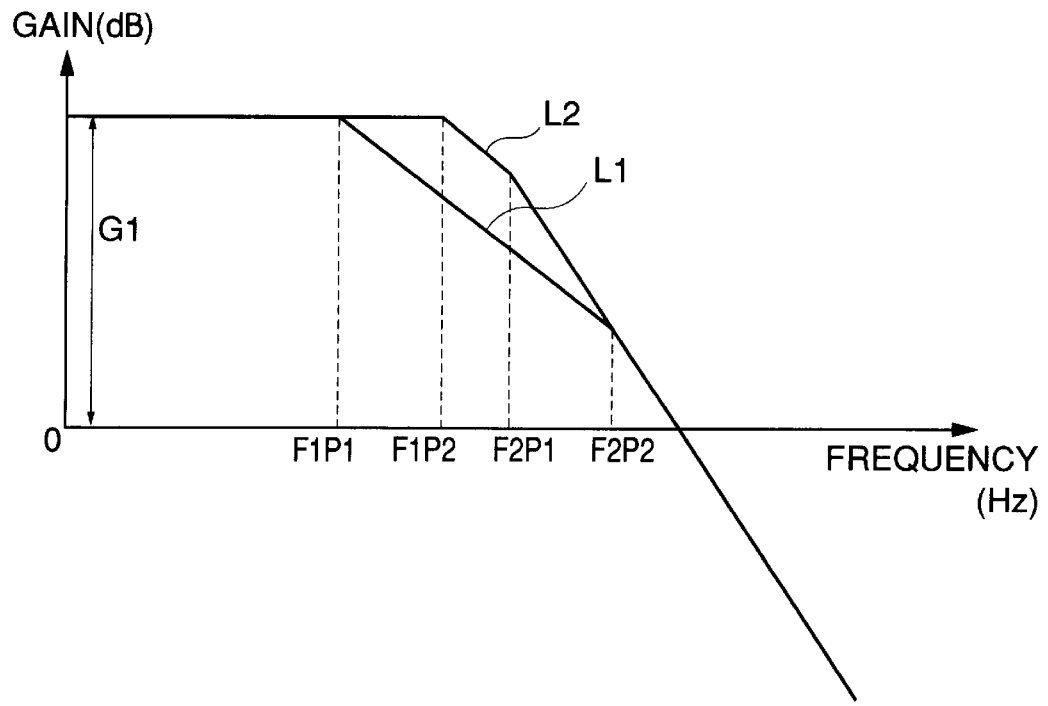
FIG. 4 is a chart showing the frequency response of another current-to-voltage conversion IC embodying the invention.
Figure 5:
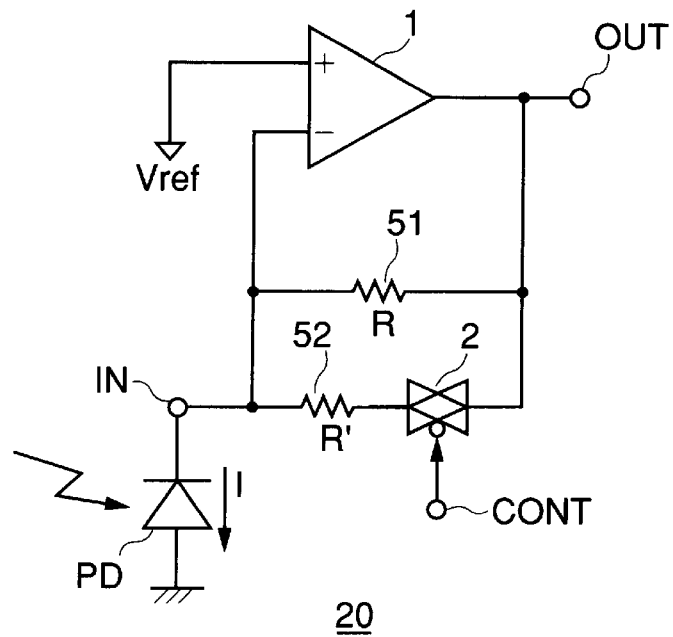
FIG. 5 is a circuit diagram of a conventional current-to-voltage conversion IC, as a first conventional example.
Figure 6:
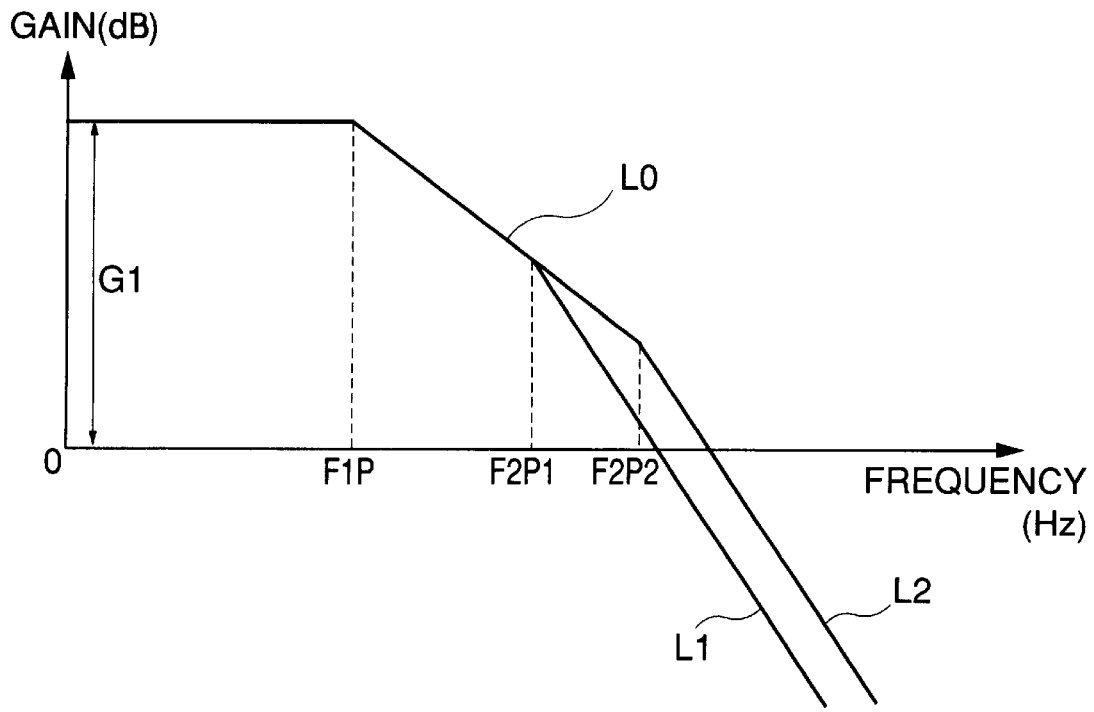
FIG. 6 is a chart showing the frequency response of the current-to-voltage conversion IC of the first conventional example.
Figure 7:
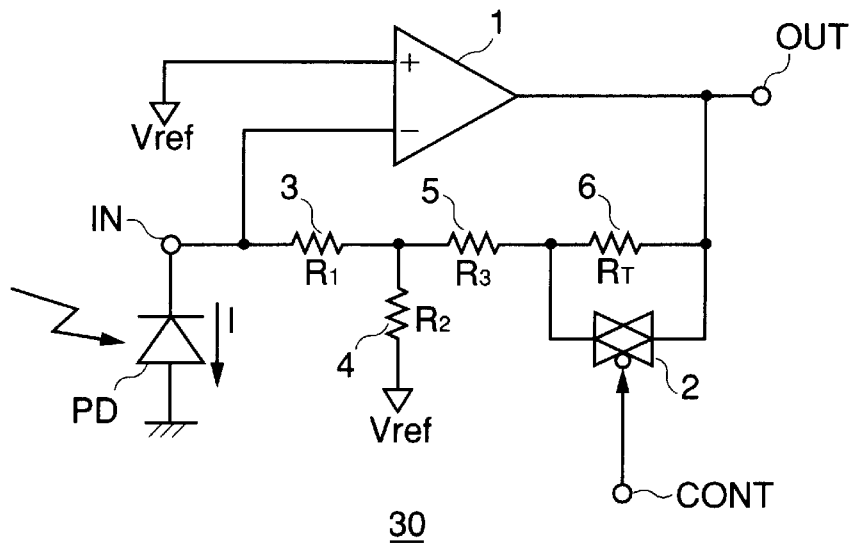
FIG. 7 is a circuit diagram of another conventional current-to-voltage conversion IC, as a second conventional example.
Figure 8:
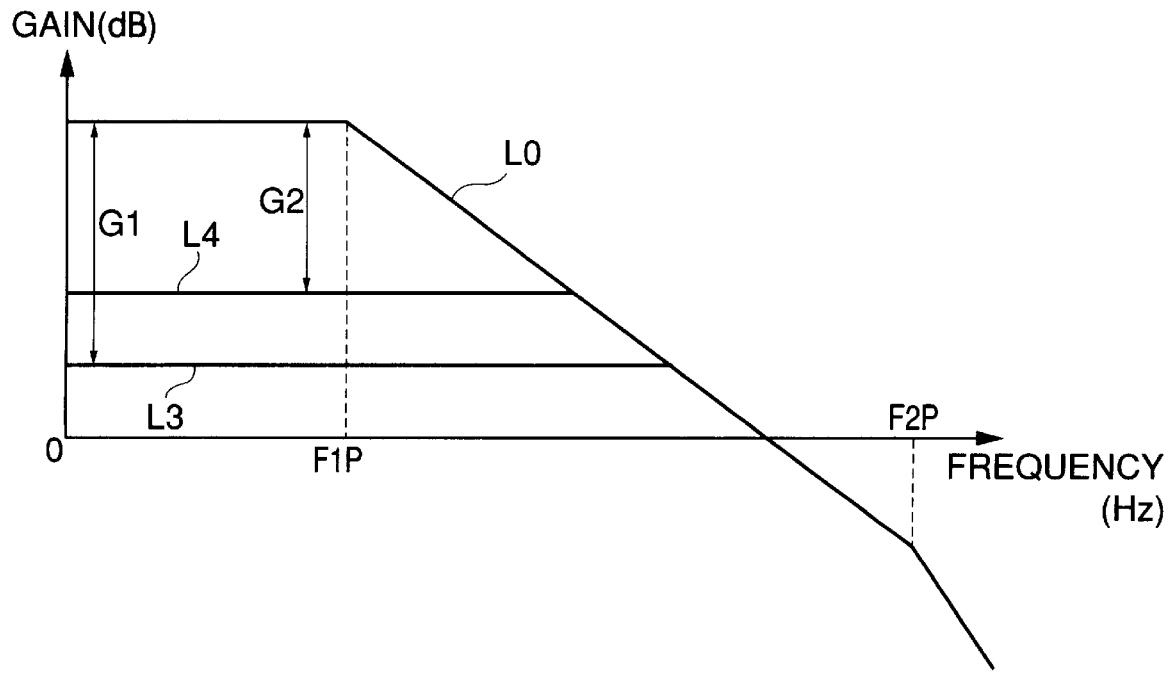
FIG. 8 is a chart showing the frequency response of the current-to-voltage conversion IC of the second conventional example.

FIG. 4 shows the frequency response of this current-to-voltage conversion IC. In FIG. 4, the following symbols are used:

F1P1 indicates the frequency of the pole created by the operational amplifier 1 itself (i.e. the first pole frequency) when the analog switch SW is on;

F1P2 indicates the frequency of the pole created by the operational amplifier 1 itself (i.e. the first pole frequency) when the analog switch SW is off;

F2P1 indicates the frequency of the pole created by the feedback loop (i.e. the second pole frequency) when the analog switch 2 is off;

F2P2 indicates the frequency of the pole created by the feedback loop (i.e. the second pole frequency) when the analog switch 2 is on;

G1 indicates the loop gain (when (feedback ratio)=1);

L1 indicates the gain obtained when the analog switches 2 and SW are on (i.e. when the first pole frequency is low and the second pole frequency is high); and L2 indicates the gain obtained when the analog switches 2 and SW are off (i.e. when the first pole frequency is high and the second pole frequency is low).

The above-described embodiments of the present invention deal with current-to-voltage conversion ICs that require the use of a separate photodiode. However, the present invention is applicable also to photoelectric conversion ICs, generally called OEICs, that has a photodiode, too, integrated into them.

As described heretofore, according to the present invention, it is possible to realize a current-to-voltage conversion IC or photoelectric conversion IC in which the conversion gain can be increased without narrowing the available frequency range. This helps improve the performance of the appliances that employ such current-to-voltage conversion ICs or photoelectric conversion ICs; for example, it is possible to obtain stable reproduction quality even in CD players that offer more than 20 times the standard speed, in DVD players that offer three times the standard speed, and the like.

Obviously, many modifications and variations of the present invention are possible in light of the above teachings. It is therefore to be understood that within the scope of the appended claims, the invention may be practiced other than as specifically described.

What is claimed is:

1. A current-to-voltage conversion IC comprising:

a negative feedback resistor;

a photodiode to serve as a photoelectric conversion device;

an amplifier to which said negative feedback resistor is connected and said photodiode connected to an input terminal of said amplifier, said amplifier for converting an output current of said photodiode into a voltage by means of said negative feedback resistor; and means for varying a resistance of said negative feedback resistor and a capacitance of a capacitor used as a phase compensating element within said amplifier in an interlocked manner in accordance with a signal fed from outside said current-to-voltage conversion IC.

2. An optical pickup device comprising a current-to-voltage conversion IC as claimed in claim 1, further comprising a light source, for reading data recorded on a recording medium by directing light from said light source onto the recording medium and detecting light reflected from the recording medium by means of said photodiode and said current-to-voltage conversion IC.

3. A photoelectric conversion IC comprising:

a negative feedback resistor;

a photodiode serving as a photoelectric conversion device;

an amplifier to which said negative feedback resistor is connected, said amplifier for converting an output current of said photodiode into a voltage by means of said negative feedback resistor; and means for varying a resistance of said negative feedback resistor and a capacitance of a capacitor used as a phase compensating element within said amplifier in an interlocked manner in accordance with a signal fed from outside said photoelectric conversion IC.

4. An optical pickup device comprising a photoelectric conversion IC as claimed in claim 3, further comprising a light source, for reading data recorded on a recording medium by directing light from said light source onto the recording medium and detecting light reflected from the recording medium by means of said photoelectric conversion IC.

* * * * *